United States Patent
Kobayashi

(10) Patent No.: US 6,373,346 B1
(45) Date of Patent: Apr. 16, 2002

(54) LASER DRIVER PRE-EMPHASIS AND DE-EMPHASIS METHOD AND/OR ARCHITECTURE WITH TUNING AND DUTY CYCLE CONTROL

(75) Inventor: Kevin Wesley Kobayashi, Torrance, CA (US)

(73) Assignee: Sirenza Microdevices, Inc., Sunnyvale, CA (US)

( * ) Notice: Subject to any disclaimer, the term of this patent is extended or adjusted under 35 U.S.C. 154(b) by 0 days.

(21) Appl. No.: 09/723,037

(22) Filed: Nov. 27, 2000

(51) Int. Cl.⁷ .............................................. H03C 1/06
(52) U.S. Cl. ...................................... 332/162; 332/159
(58) Field of Search ................................ 332/149, 159, 332/162

(56) References Cited

U.S. PATENT DOCUMENTS

| | | | |
|---|---|---|---|
| 5,646,573 A | 7/1997 | Bayruns et al. ............... | 330/59 |
| 5,793,782 A | * 8/1998 | Meyrueix .................... | 372/26 |

OTHER PUBLICATIONS

Novel Switched Current Source for Increasing Output Signal Edge Steepness of Current Switches Without Generating Large Overshoot, By Rainer G. Derksen, IEEE Journal of Solid–State Circuits, vol. 30, No. 5, May 1995, pp. 612–615.

A 0.4–$\mu$m CMOS 10–Gb/s 4–PAM Pre–Emphasis Serial Link Transmitter, By. Ramin Farjad–Rad et al., IEEE Journal of Solid–State Circuits, vol. 34, No. 5, May 1999, pp. 580–585.

Integrated High Frequency Low–Noise Current–Mode Optical Transimpedance Preamplifiers: Theory and Practice, By Tongtod Vanisri et al., IEEE Journal of Solid–State Circuits, vol. 30, No. 6, Jun. 1995, pp. 677–685.

Kevin Wesley Kobayashi et al., "Peaking Control for Wideband Laser Driver Applications", U.S. application No. 09/723,298, filed Nov. 27, 2000.

* cited by examiner

Primary Examiner—David Mis
(74) Attorney, Agent, or Firm—Christopher P. Maiorana, P.C.

(57) ABSTRACT

An apparatus comprising a modulator circuit, a first and a second control circuit. The modulator circuit may be configured to generate a modulated differential output signal in response to a differential input signal. The first control circuit may be configured to control a first predistortion of the differential input signal in response to a first portion of the differential output signal. The second control circuit may be configured to control a second predistortion of the differential input signal in response to a second portion of the differential output signal.

19 Claims, 10 Drawing Sheets

LASER DRIVER PRE-EMPHASIS AND DE-EMPHASIS METHOD AND/OR ARCHITECTURE WITH TUNING AND DUTY CYCLE CONTROL

CROSS-REFERENCE TO RELATED APPLICATION(S)

The present invention may relate to co-pending application Ser. No. 09/723,298, filed Nov. 27, 2000, which is hereby incorporated by reference in its entirety.

FIELD OF THE INVENTION

The present invention relates to a method and/or architecture for implementing a transmitter and/or receiver amplifier generally and, more particularly, to a method and/or architecture for implementing laser driver amplifiers that may shape or equalize the waveform of a high data rate output signal.

BACKGROUND OF THE INVENTION

The need for broadband integrated circuits (ICs) that incorporate peaking control is becoming a necessity as data rates and traffic of fiber optic systems increase. Pre-emphasis or predistortion in wideband integrated circuits is useful for adjusting gain and amplitude peaking in the frequency domain. Additionally, tailoring the rising and falling edges of a signal waveform in the time domain in order to achieve lower bit error rates in fiber optic data transceiver links has also been proposed. The need for increased peaking control becomes more imperative for 10 gigabit per second fiber optic applications that require high volume high yield ICs that have a low tolerance to semiconductor process variations. Such applications include the emerging 10 gigabit Ethernet datacom system.

A broadband IC which can modulate lasers or vertical cavity surface emitting lasers (VCSELs) at data rates up to 10 Gb/s and maintain low bit error rates is coveted by engineers building high speed Ethernet systems. In practice, laser driver ICs require pre-emphasis circuits or some kind of predistortion circuit which can compensate for the distortion introduced by the nonlinear laser or VCSEL. The signal passing through a linear laser driver modulator operating at 10 Gb/s can become distorted in the process of converting from electrical to optical energy as the laser diode or VCSEL is modulated by the linear electrical driver circuit. In such a situation, the laser or VCSEL can be driven with a predistorted signal to compensate for the distortion produced by the nonlinear behavior of the VCSEL or laser.

The predistortion may be implemented by a pre-emphasis or peaking function that superimposes a weighted peaking signal on the original signal to speed up the rising and falling edges of the original data waveform. The predistortion enhances the data transition rise and fall times as well as reshapes the signal for low bit error rates (BER), inter-symbol interference (ISI), and maximum eye pattern opening.

Several conventional approaches for employing predistortion include [1] dynamic current source switching (e.g., Rainer H. Derksen, Novel Switched Current Source for Increasing Output Signal Edge Steepness of Current Switches Without Generating Large Overshoot, IEEE JSSC, vol. 30, no. 5, May 1995) and [2] pre-emphasis (digital peaking) (e.g., Ramin Farjad-Rad, et al., A 0.4-um CMOS 10-Gb/s 4-PAM Pre-Emphasis Serial Link Transmitter, IEEE JSSC, vol. 34, no. 5, May 1999). The techniques [1] and [2] are common approaches which have had practical implementations at low data rates of 2.5 Gb/s and below. However, the implementations of the techniques [1] and [2] at higher data rates is challenging. The effectiveness of the techniques [1] and [2] can be marginal at rates of 10 Gb/s and higher due to the quality of the raw data signal which provides a clock or trigger for the technique.

Additionally analog approaches do not rely on the raw data waveform as a clock or synchronizing signal for the technique to be effective. Therefore the analog approaches are more amenable to higher data rate applications. Due to the recent availability of long and short wave VCSEL technology for 10 Gb/s, an effective approach for employing pre-emphasis or peaking control for 10 Gb/s VCSEL driver applications which is amenable to high volume-high yield manufacturing is needed.

SUMMARY OF THE INVENTION

The present invention concerns an apparatus comprising a modulator circuit, a first and a second control circuit. The modulator circuit may be configured to generate a modulated differential output signal in response to a differential input signal. The first control circuit may be configured to control a first predistortion of the differential input signal in response to a first portion of the differential output signal. The second control circuit may be configured to control a second predistortion of the differential input signal in response to a second portion of the differential output signal.

The objects, features and advantages of the present invention include providing pre-emphasis and/or de-emphasis predistortion circuit that may provide (i) orthogonal pre-emphasis and de-emphasis controls for employing varying degrees of pre-emphasis and de-emphasis; (ii) duty cycle distortion correction control for recovering from undesirable duty cycle distortion produced by the pre-emphasis and/or de-emphasis control circuit; (iii) AC coupling of the peaking amplifier with a speedup capacitor and resistor which allow a degree of freedom to set up a decay time constant; and/or (iv) variability in an AC coupling tap point in order to optimize the time superposition of the pre-emphasis and/or de-emphasis signals at the output of the laser modulator driver.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The co-pending application cited involves the employment of a peaking control circuit for shaping the data waveform that may provide clearer eye diagram opening, lower bit error rates and lower intersymbol interference (ISI). The co-pending application addresses the need for peaking or pre-emphasis of the electronic signal produced by the laser driver. In some situations, there may also be a need for de-emphasis of the rising and falling edge of the signal when excessive peaking is present. Such excessive peaking can be a result of one or more of the following (i) circuit performance sensitivity due to semiconductor manufacture variations, (ii) poor voltage standing wave ratio (VSWR) mismatch between the IC and the laser diode, (iii) unwanted peaking due to other components, and/or (iv) variations in laser diode distortion characteristics. Under such circumstances, de-emphasis may be implemented to reduce the intersymbol interference generated by the excessive peaking. Since it cannot be determine with any certainty whether emphasis or de-emphasis is required, the present invention can independently incorporate both emphasis and de-emphasis control. The present invention may also correct duty cycle distortions created by pre-emphasis, de-emphasis, or both.

The present invention may provide a unique analog orthogonally controlled pre-emphasis and de-emphasis control topology that incorporates a duty cycle control circuit for correcting the duty cycle distortion introduced by the pre-emphasis and de-emphasis control means. Orthogonal or independent control of signal pre-emphasis and de-emphasis may facilitate the optimization of a system, while DCD corrections may be used in an automatic control loop to correct for distortion induced by a particular pre-emphasis and/or de-emphasis technique. The present invention may allow significant performance benefits for data rates in excess of 10 Gb/s and may provide enough tuning latitude to compensate for process manufacturing variations, laser diode distortion characteristic variations, and/or other detrimental driver-to-laser diode mismatch effects.

Figure 1:
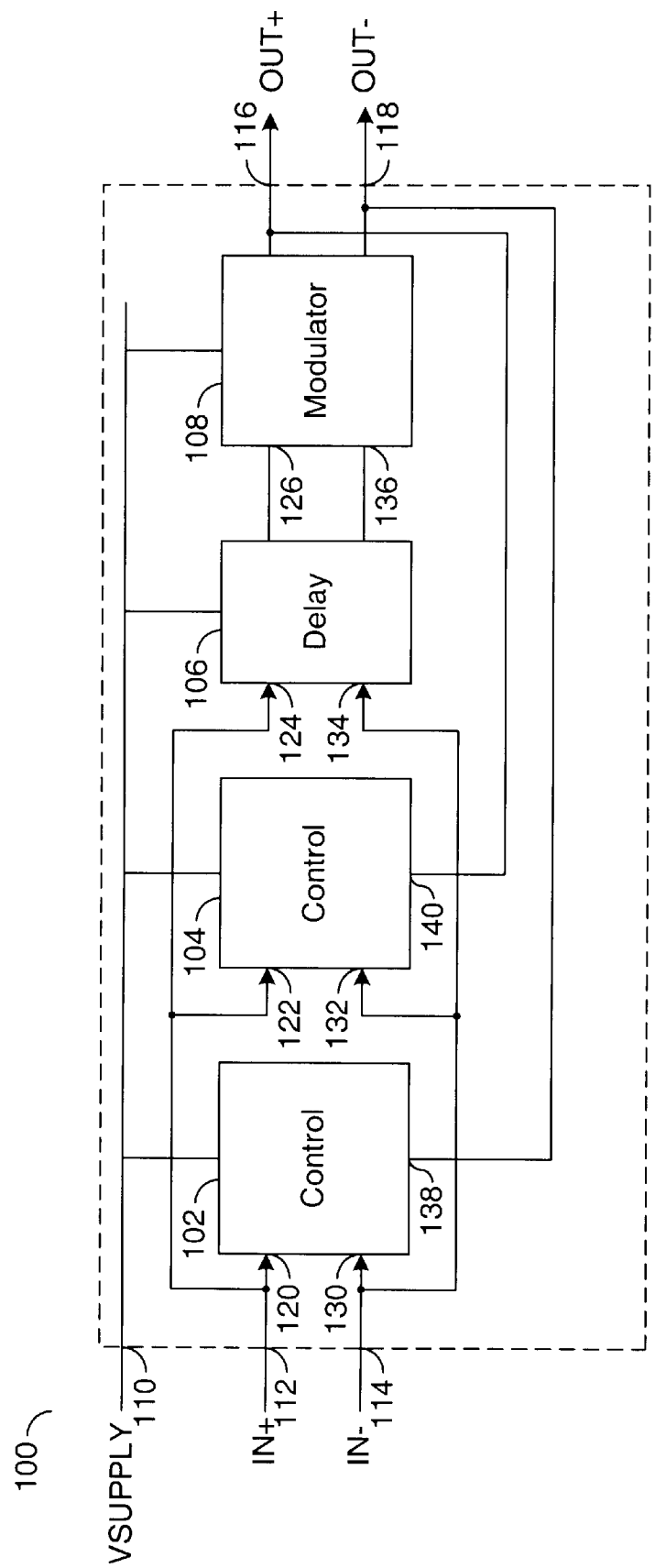
FIG. 1 is a block diagram of a preferred embodiment of the present invention.

Referring to FIG. 1, a block diagram of a circuit 100 is shown in accordance with a preferred embodiment of the present invention. The circuit 100 generally comprises a control circuit 102, a control circuit 104, a delay circuit 106 and a modulator circuit 108. A supply voltage (e.g., VSUPPLY) may be presented to an input 110. The supply voltage VSUPPLY is generally presented to each of the circuits 102, 104, 106 and 108. The circuit 100 may have an input 112 that generally receives a first input signal (e.g., IN+) and an input 114 that generally receives a second input signal (e.g., IN−). The signal IN+ and the signal IN− are generally differential (e.g., non-overlapping) input signals. The circuit 100 may also have an output 116 that may present an output signal (e.g., OUT+) and an output 118 that may present an output signal (e.g., OUT−). The signal OUT+ and the signal OUT− may be implemented as differential (e.g., non-overlapping) output signals.

The signal IN+ is generally presented to an input 120 of the control circuit 102, an input 122 of the control circuit 104 and an input 124 of the delay circuit 106. The delay circuit 106 generally presents a delayed version of the signal IN+ to an input 126 of the modulator circuit 108. Similarly, the signal IN− is generally presented to an input 130 of the control circuit 102, an input 132 of the control circuit 104, and an input 134 of the delay circuit 106. The delay circuit 106 generally presents a delayed version of the signal IN− to an input 136 of the modulator circuit 108.

The control circuit 102 may also have an output 138 that generally superimposes a signal at the output signal OUT−. Similarly, the control circuit 132 may have an output 140 that generally superimposes a signal at the output signal OUT+. The is control circuit 102 generally responds to the signal IN+ and the signal IN−. Furthermore, the control circuit 102 may superimpose a signal at the output signal OUT−, which is weighted by a current source (Ics1). Similarly, the control circuit 104 generally responds to the signal IN+ and the signal IN− superimposing a de-emphasized signal at the output signal OUT+, which is weighted by a current source (Ics2).

Figure 2:
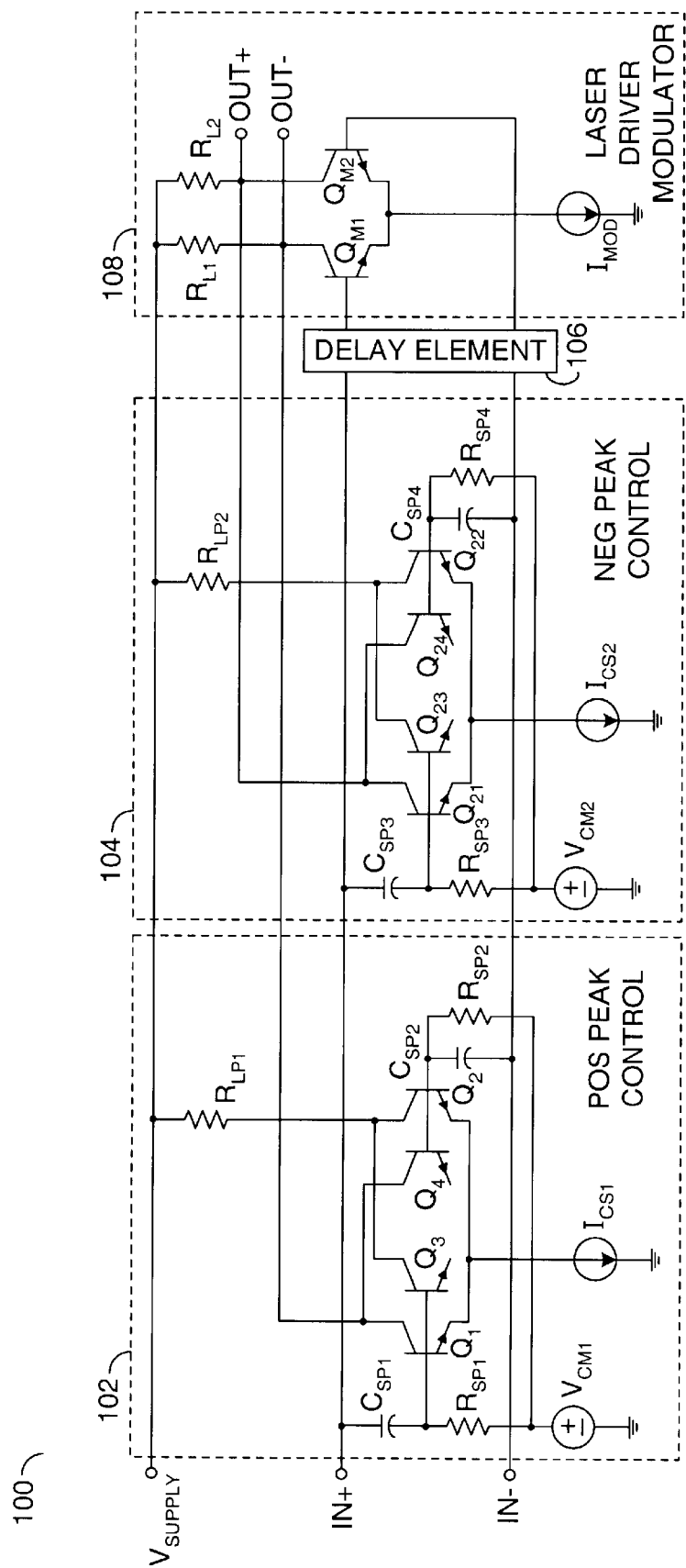
FIG. 2 is a detailed circuit schematic of a preferred embodiment of the present invention.

Referring to FIG. 2, an example of a more detailed diagram of the circuit 100 is shown. Several of the features of the circuit 100 have been described in the referenced co-pending application. Such features include (i) the cross coupled transistors (e.g., Q3, Q4, Q23, Q24) which may provide regenerative capacitive feedback, (ii) the delay element 106 for adjusting the time based employment of the emphasis or peaking circuit, and the AC coupling capacitors (e.g., Csp) and the associated shunt resistor (e.g., Rsp) for setting the decay time of the emphasis or peaking response.

The circuit 102 may provide positive peak control or pre-emphasis. The circuit 104 may provide negative peak control or de-emphasis. The circuit 108 may be implemented as a laser driver modulator differential output stage with complementary output signals OUT+ and OUT−. The control circuit 102 generally comprises a differential transistor pair Q1 and Q2, and a current source Ics1. The differential transistor pair Q1 and Q2 may have cross-coupled regenerative feedback comprised of a number of transistors Q3 and Q4. The transistors Q3 and Q1 generally provide an area scaled collector-base capacitance for controlling the amount of positive feedback inherent in the pre-emphasis circuit 104. A load of a collector of the transistor Q1 (having a base connected to the positive input IN+), is generally connected to the negative output OUT− of the laser driver output stage 108. A load of a collector of the transistor Q2 is provided by a dummy load RLP connected to the supply voltage VSUPPLY.

The current source Ics1 may provide a weighting factor for the degree of pre-emphasis desired. When the current source Ics1=0, zero pre-emphasis will be implemented. When the current source Ics1 increases, an increasing degree of pre-emphasis will occur. The inputs of the pre-emphasis circuit 102 are AC-coupled by coupling the capacitors Csp1 and Csp2, which are shunt terminated by resistors Rsp1 and Rsp2 to a low impedance voltage source. The value of the capacitors Csp1 and Csp2 may set the high pass nature of the peaking or pre-emphasis circuit 102. The time constant product (e.g., Csp*Rsp) generally sets the decay time of the time domain peaking response.

The negative peak control or de-emphasis circuit 104 generally comprises a differential transistor pair Q21 and Q22, and a current Ics2. The differential transistor pair Q21 and Q22 may have cross-coupled regenerative feedback comprised of a number of transistors Q23 and Q24. The transistors Q23 and Q24 may provide an area scaled collector-base capacitance that may control the amount of positive feedback inherent in the de-emphasis circuit 104. A load of a collector of the transistor Q21 (having a base connected to the positive input IN+ through the AC coupling capacitor Csp3), is generally connected to the positive output signal OUT+ of the laser driver output stage 108. De-emphasis of the rising and falling edge at the positive output signal OUT+ may be provided.

A load of a collector of the transistor Q22 is generally provided by a dummy load RLP connected to the supply voltage VSUPPLY. The current source Ics2 generally provides a weighting factor for the degree of de-emphasis desired. When the current source Ics2 =0, zero de-emphasis will occur. When the current source Ics2 is increased, an increasing degree of de-emphasis will occur. The inputs of the de-emphasis circuit 104 are generally AC-coupled by coupling capacitors Csp3 and Csp4 which are shunt terminated by the resistors Rsp3 and Rsp4 to a low impedance voltage source. The value of the capacitors Csp3 and Csp4 may set the high pass nature of the negative peaking or de-emphasis circuit 104. The time constant product (e.g., Csp*Rsp) generally sets the recovery time of the time domain negative peaking response.

The delay element 106, implemented between the inputs IN+ and IN− and the base terminals of the emitter coupled pair Qm1 and Qm2 of the laser driver modulator 108, may provide a delay of the input signals IN+ and IN−. The delay may cause the superposition of the positively and negatively peaked data stream with the unprocessed data signal to produce an optimal output signal with low ISI and BER. The delay 106 may be constructed in a variety of ways, such as (i) an active delay element (e.g., logic gates), (ii) passive components (e.g., inductors and capacitors), (iii) varying transmission line lengths, or (iv) other delay elements appropriate for the design criteria of a particular implementation.

The output of the circuit 100 generally produces an amplified superposition of the unprocessed data input signals IN+ and IN− with the processed signal directed to the output from the peak control circuit 102 and the peak control circuit 104. The output laser driver modulator 108 may have a current source Imod which sets the modulation current produced by the output stage 108. Collectors of the transistors Qm1 and Qm2 are generally connected to the supply voltage VSUPPLY through one or more load resistors RL1 and RL2. The outputs OUT+ and OUT− may either be directly coupled or AC coupled to one or both terminals of a laser diode (not shown).

Under normal operation (i) a complementary data signal is introduced into the inputs IN+ and IN−, (ii) the data signal is delayed through the delay element 106 and (iii) the data signal is amplified by the laser driver modulator output stage 108. The modulation current can be set by the current source Imod. Pre-emphasis may also be employed at the output signal OUT+ and OUT− by providing a finite current source Ics1 whose value provides the weight of the pre-emphasis signal produced by the positive peak control circuit 102. Pre-emphasis control is provided by incorporating the tunable current source Ics1. Regeneration can be optimized in the design by scaling the area of the transistors Q3 and Q4 whose connectivity provides positive feedback through collector-base capacitances. In a like manner, de-emphasis can be employed at the output signal OUT+ and OUT− by providing a finite current source Ics2 whose value provides the weight of the de-emphasis signal produced by the negative peak control circuit 104. De-emphasis control is provided by incorporating the tunable current source Isc2. De-emphasis can be optimized in the design by scaling the area the of transistors Q23 and Q24 during fabrication.

Figure 3A:
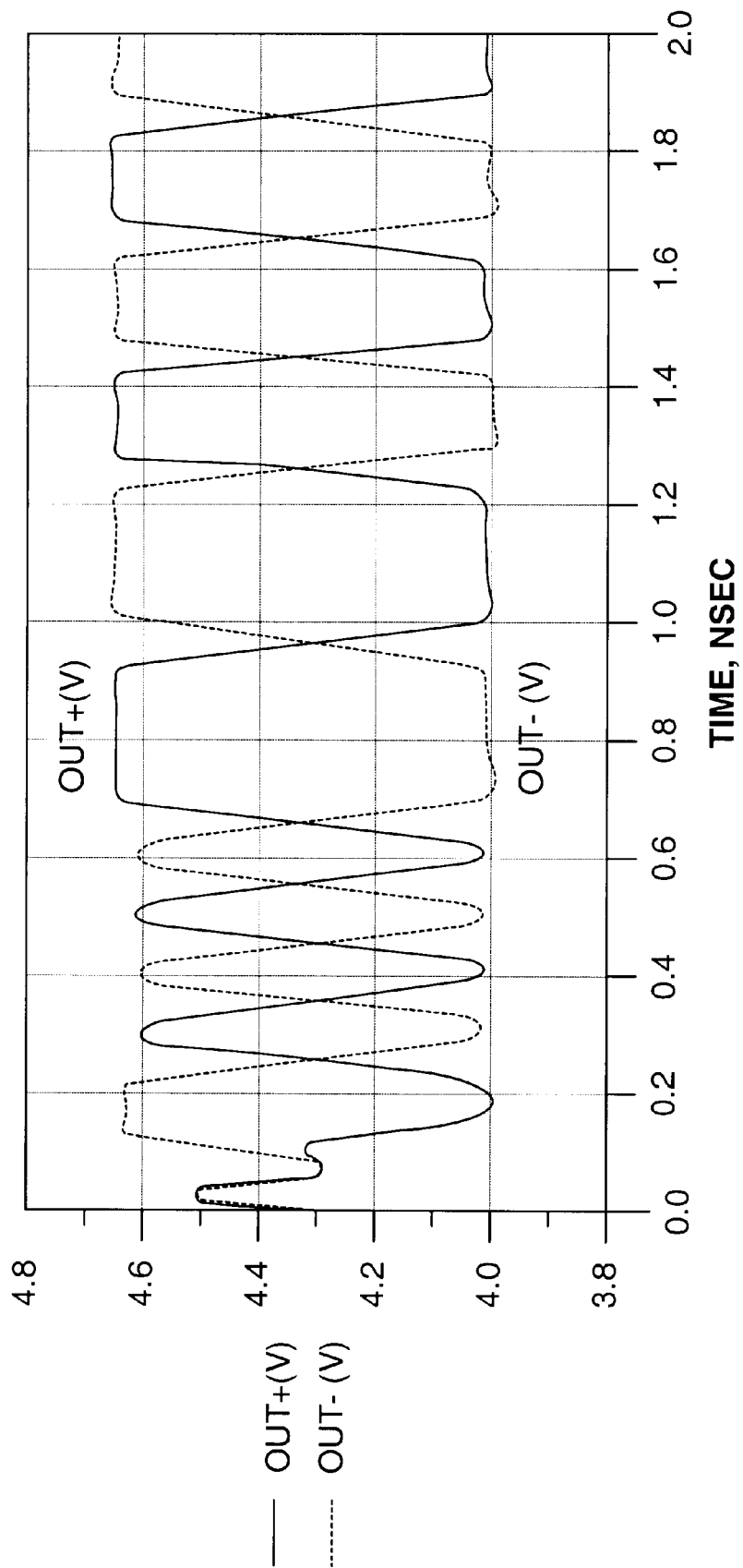
FIGS. 3(a–b) are plots illustrating balanced (no pre-emphasis and no de-emphasis) operations of the present invention.
Figure 3B:
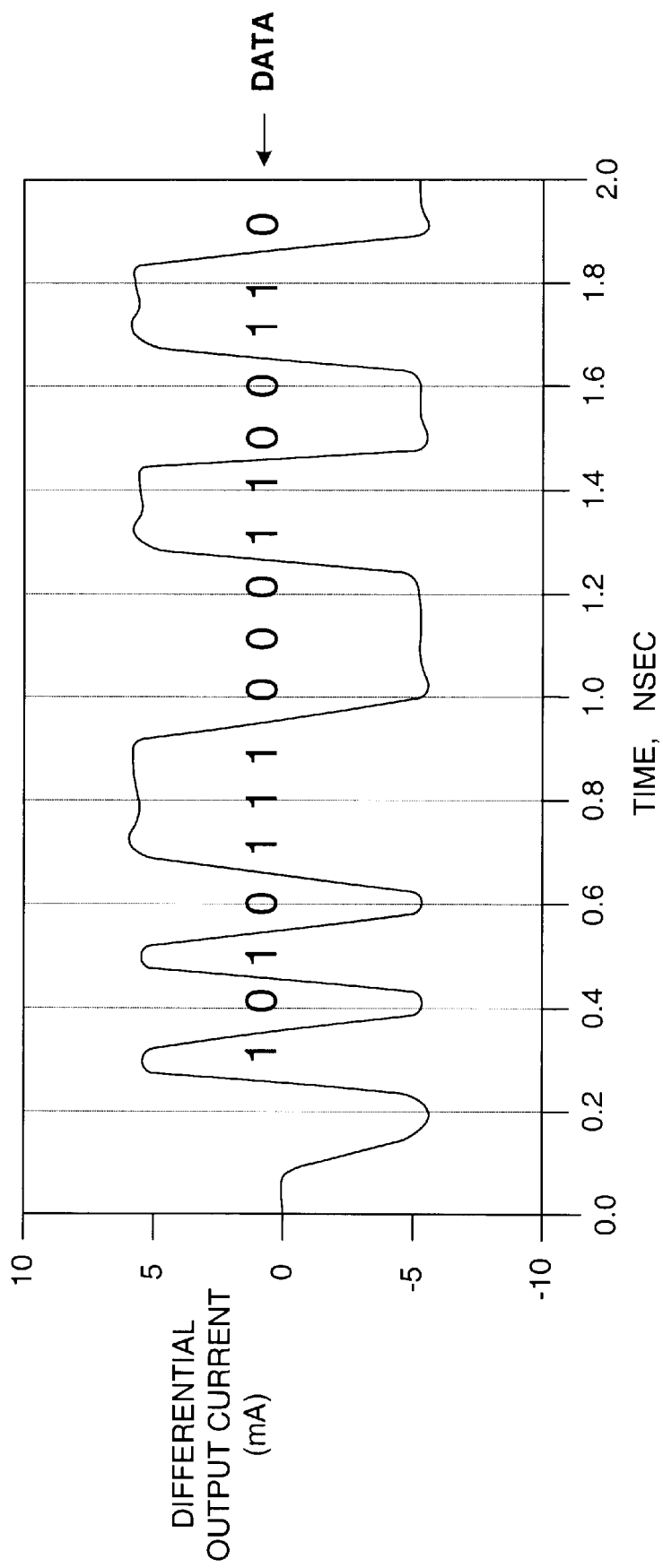

A model of the operation of the preferred embodiment of the circuit 100 is shown in FIGS. 3–5 using a commercially available InGaP heterojunction bipolar transistor (HBT) process with a typical frequency of 35 GHz. FIG. 3a illustrates the complementary output voltage response produced for the case where no emphasis and no de-emphasis are employed (Ics1=Ics2=0). FIG. 3b illustrates the associated differential output current waveform in response to a input data stream. This case shows the AC-coupled output current delivered to a 100 ohm differential resistive load. When driving a laser diode, the expected optical output will have a degree of distortion which normally needs to be compensated for by the pre-emphasis and de-emphasis circuits 102 and 104. Since it is not easy to predict the nonlinear behavior of the laser diodes of a particular manufacturer, the circuit 100 provides both pre-emphasis and de-emphasis to handle a variety of possible manufacture variations ranging from mechanical assembly, semiconductor processing, and architectural implementation.

Figure 4A:
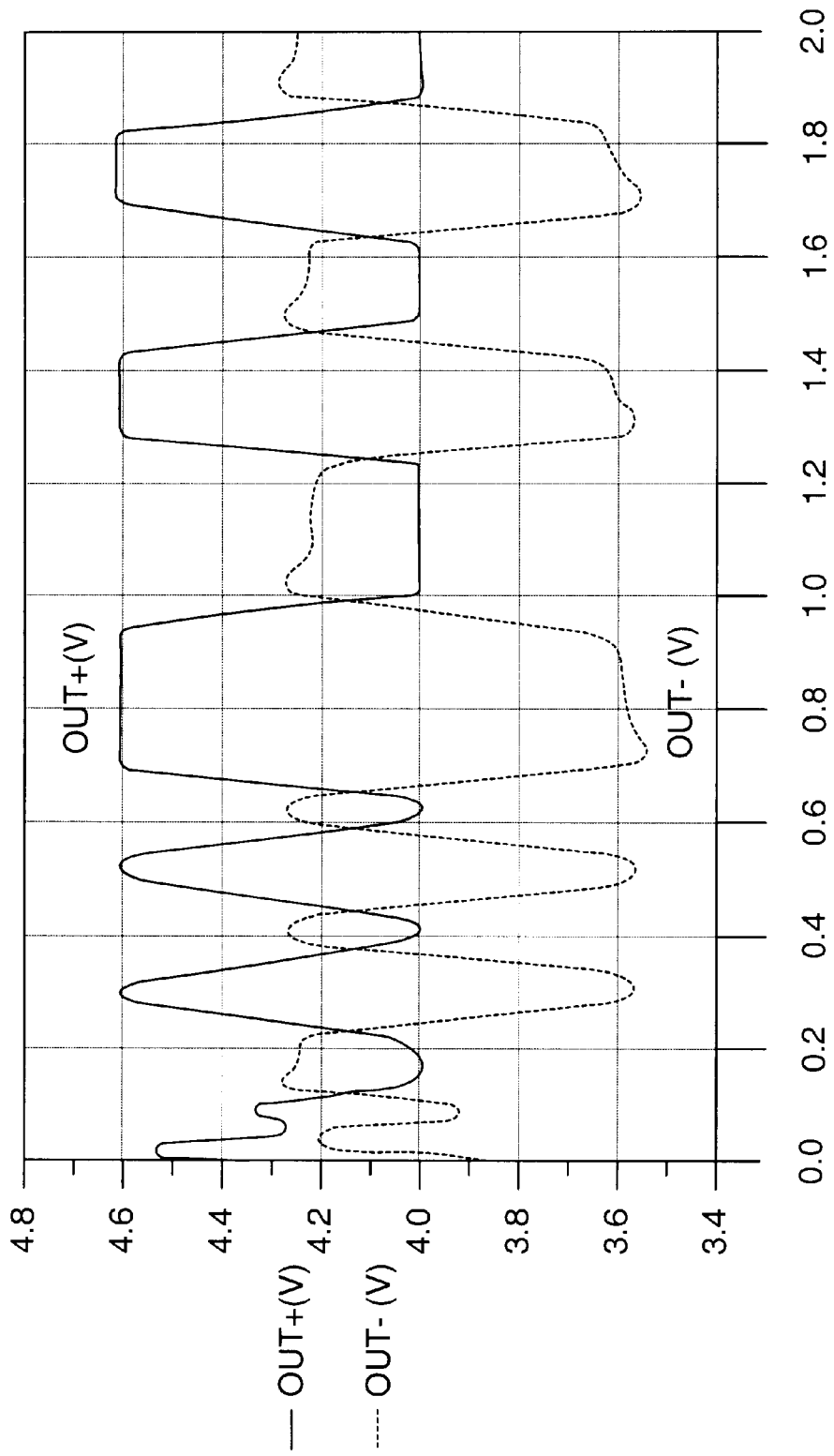
FIGS. 4(a–b) are plots illustrating pre-emphasis operations of the present invention.
Figure 4B:
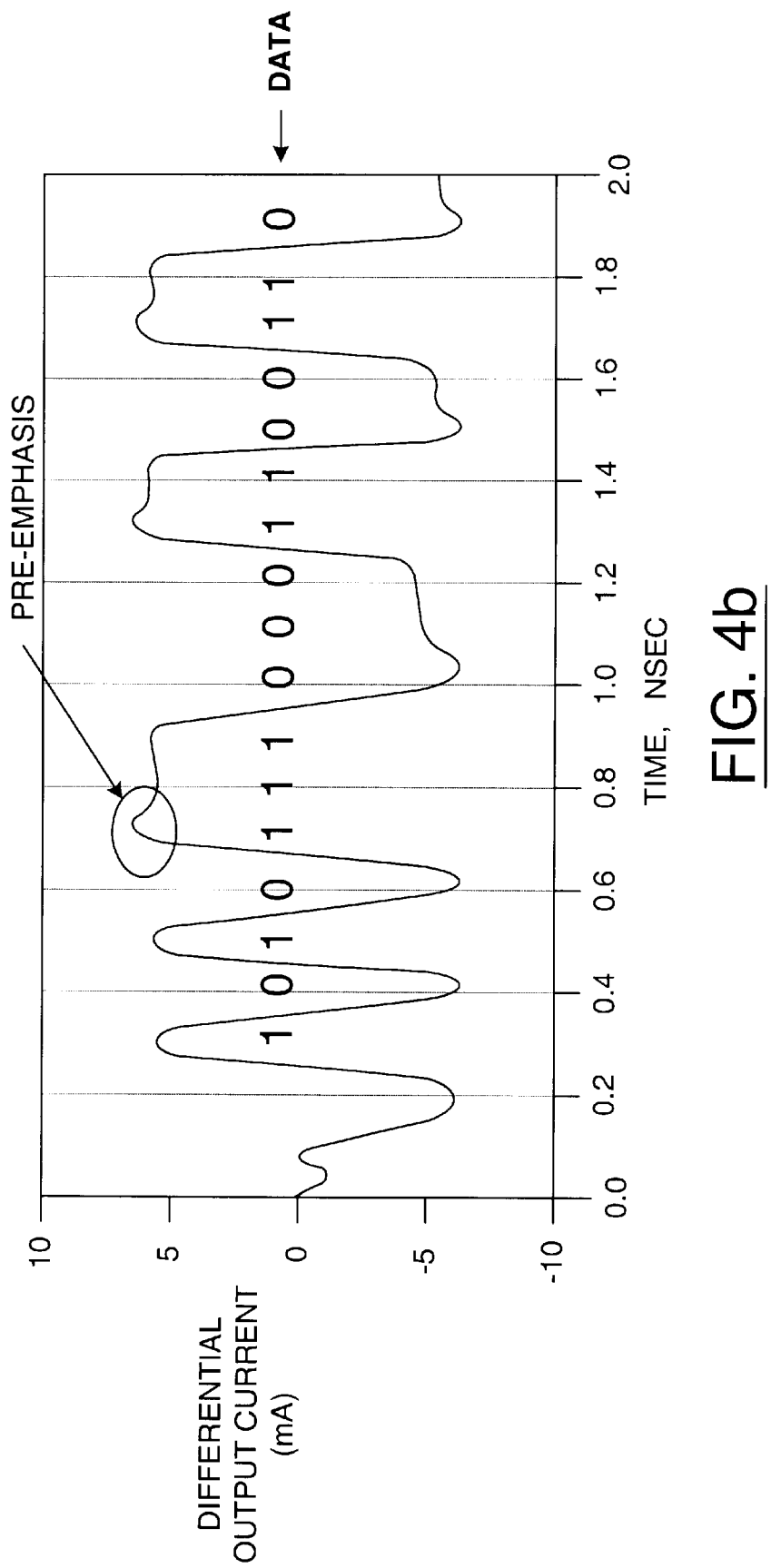

FIG. 4a illustrates the complementary output voltage response produced for the case where the pre-emphasis has been activated (Ics1>0). FIG. 4a shows that the voltage of output signal OUT− has a positive rise and fall time voltage peaking (or overshoot). The signal OUT+ shows no evidence of peaking, which is as expected. By tuning the pre-emphasis current source Ics1, a weighting factor can be adjusted for increasing or decreasing the amount of pre-emphasis. FIG. 4b illustrates the differential AC coupled output current into a 100 ohm differential load. The positive peaking or pre-emphasis response on the rising and falling edges of the output current signal can be adjusted to compensate for the nonlinear distortion introduced by the laser diode.

Figure 5A:
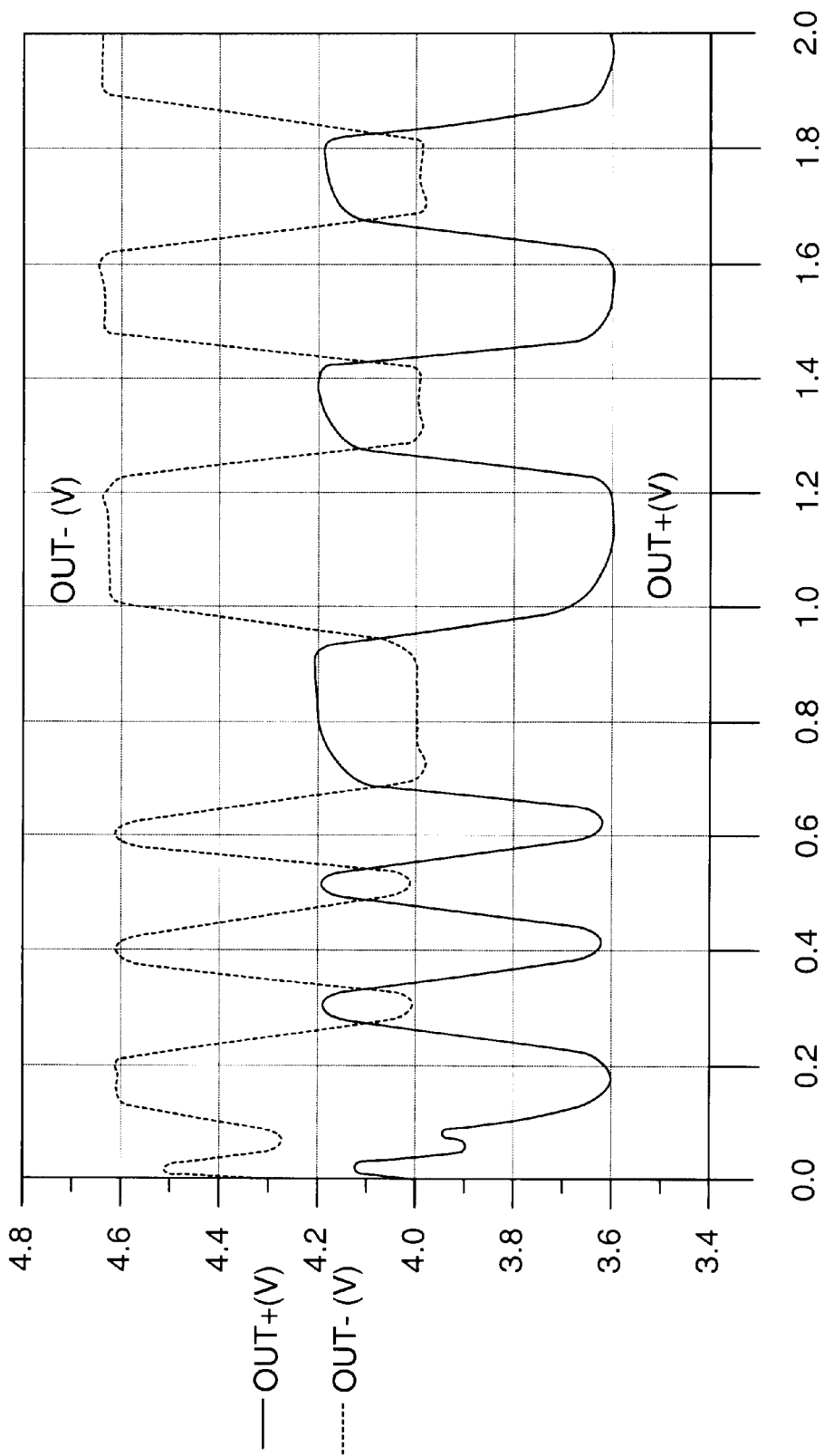
FIGS. 5(a–b) are plots illustrating de-emphasis operations of the present invention.

For circumstances where excessive peaking is introduced to the system, de-emphasis may be required. FIG. 5a illustrates the case where de-emphasis is employed (Ics2>0). In this case the rising and falling edge of the signal OUT+ is de-emphasized with an RC type of transient response on the rising and falling edges. Note that in this case the OUT− remains unchanged, as expected, since there is no pre-emphasis activated.

Figure 5B:
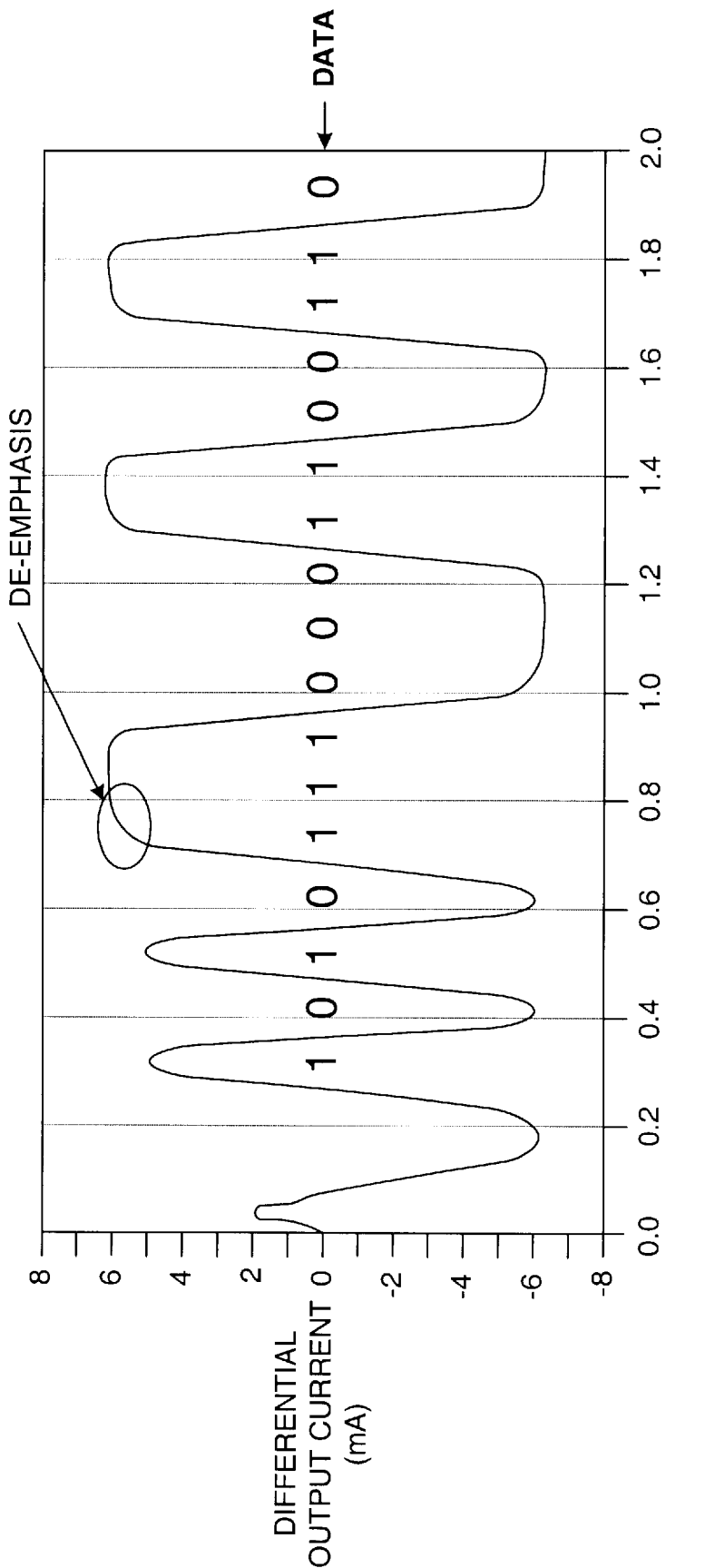

In this manner, an independent pre-emphasis and de-emphasis is shown by independently applying pre-emphasis and de-emphasis on positive and negative outputs. FIG. 5b illustrates the differential AC-coupled output current into a 100 ohm differential load. The negative peaking or de-emphasis response on the rising and falling edges of the output current signal can be adjusted to compensate for a peaky response that can result from variations in assembly, semiconductor processing, or laser diode manufacturer variations.

The pre-emphasis and de-emphasis provided by the circuit 100 may introduce duty cycle distortion which can be seen in FIGS. 4a and 5a when compared to FIG. 3a. FIGS. 4a and 5a illustrate the pre-emphasis and de-emphasis complementary output voltage waveforms that are shifted in DC levels due to the unbalanced DC nature of the pre-emphasis and de-emphasis circuits 102 and 104. In the case where the laser driver is directly coupled to the laser driver output signals OUT+ and OUT−, this DC unbalance may cause severe duty cycle distortion that may require further compensation.

Figure 6:
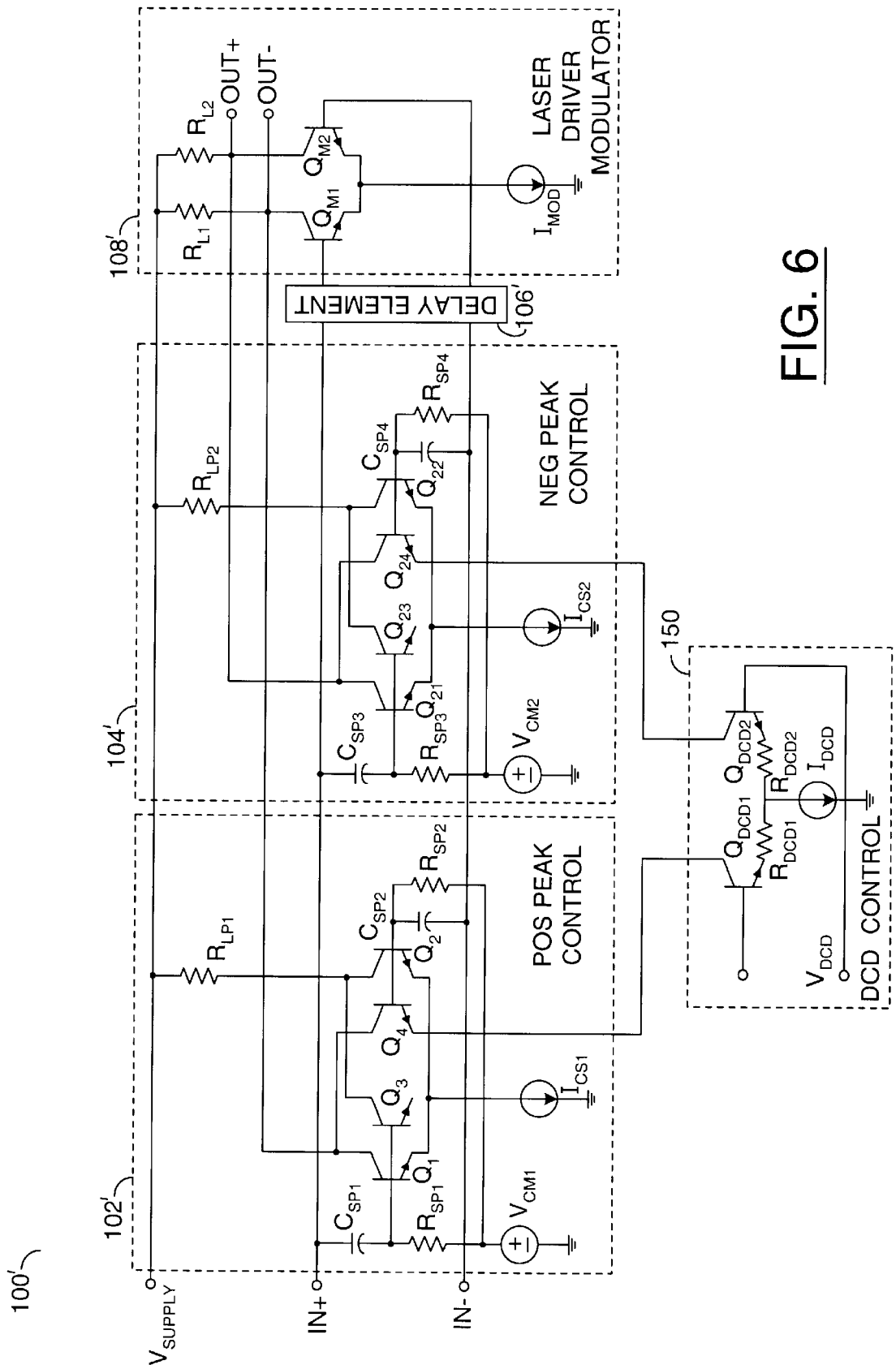
FIG. 6 is a detailed block diagram of an alternate embodiment of the present invention.

FIG. 6 illustrates an alternate embodiment of a circuit 100' of the invention. The circuit 100' provides similar connectivity to the circuit 100 with the addition of a control circuit 150. The control circuit 150 generally comprises duty cycle distortion control input voltage (e.g., VDCD), an emitter coupled transistor pair Qdcd1, Qdcd2, one or more degeneration resistors Rdcd1 and Rdcd2, and a current source Idcd. The control circuit 150 may be implemented as a duty cycle distortion (DCD) control circuit that compensates for the DC offset that may be introduced by the pre-emphasis and de-emphasis circuits 102 and 104. The control circuit 150 may provide a current source current that may be steered between the emitters of the transistor Q4 and Q24. Therefore, varying degrees of DC offset can be employed at the output signals OUT+ and OUT− without impacting the performance of the original positive and negative peak control functions. The emitter degeneration resistors Rdcd1 and Rdcd2 are used to set the control sensitivity of the input DCD control voltage VDCD. The current source Idcd may be set or tuned in magnitude to implement enough current steering latitude to compensate for the output DC offset produced by the pre-emphasis and de-emphasis circuits 102' and 104'. By connecting the switched current sources (through the transistors Qdcd1 and Qdcd2) to the emitters of the transistor Q4 and Q24, the DCD control circuit 150 may be incorporated with minimal impact to the operation of the positive and negative peak control circuits 102' and 104'.

Figure 7:
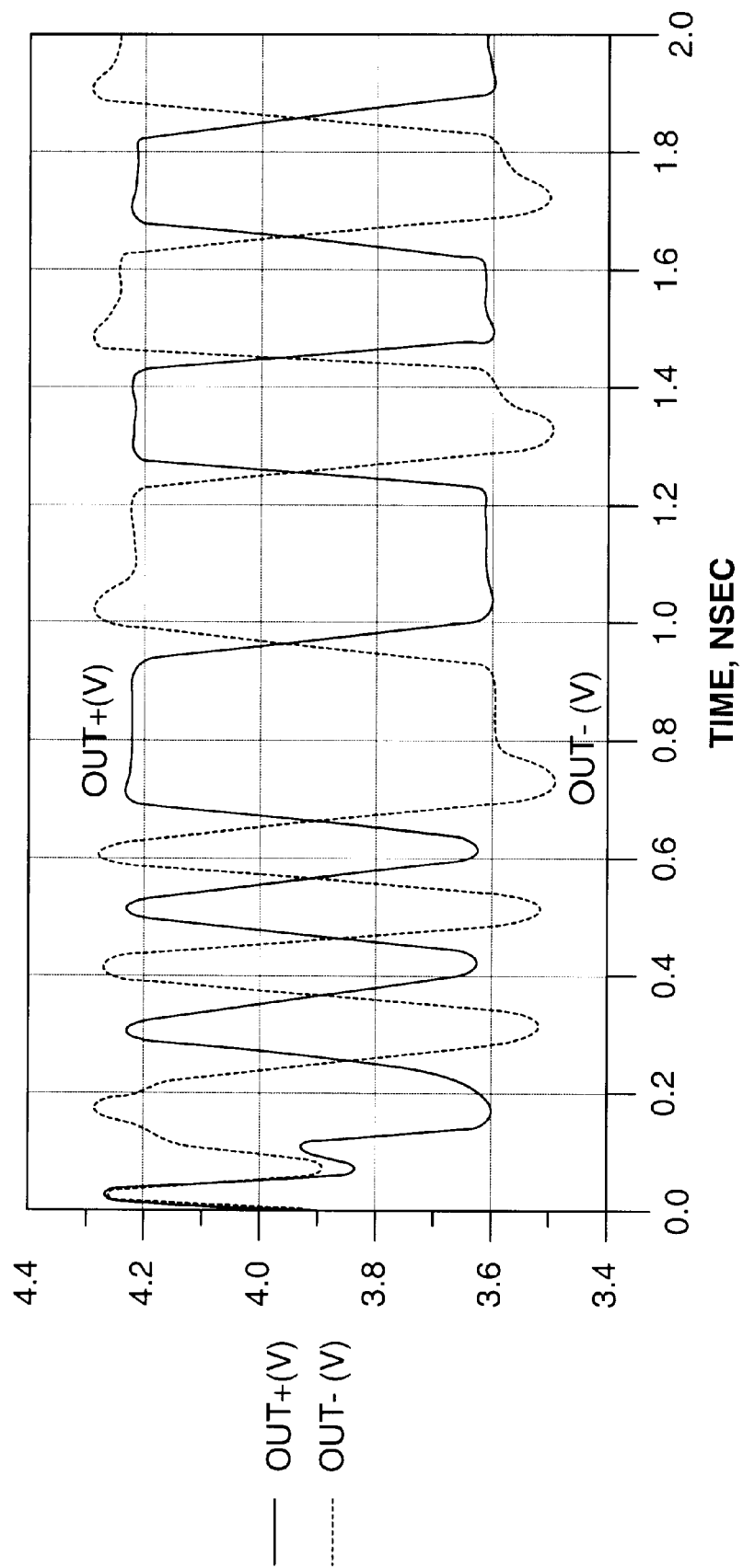
FIG. 7 is a plot illustrating a duty cycle distortion compensation operation of the present invention.

The operation of the DCD control circuit 150 can be illustrated by taking the example where pre-emphasis is employed. When pre-emphasis is employed, the current source Ics1 is finite and superimposes a pre-emphasis wave form at the output OUT−. Effectively, the superposition comprises more drawn current (Ics1) which is sourced through the collector of the transistor Q1 and pulls down the DC voltage level of the output signal OUT− with respect to the output signal OUT+ (FIG. 4a illustrates such an example). In order to compensate for the DC offset (which ultimately can result in premature limiting and duty cycle distortion) a negative voltage can be applied as the voltage VDCD. The negative voltage may steer more source current Idcd through the collector of the transistor Qdcd2 and, ultimately, the collector of the transistor Q21. This results in reducing the DC output voltage level of the output signal OUT+. By adjusting the total current Idcd and applied control voltage VDCD, DC offset unbalance can be compensated for, as shown in FIG. 7. In particular, FIG. 7 illustrates the employment of pre-emphasis and DCD correction (via the DCD circuit 150) which sets the DC output offset to zero, minimizing duty cycle distortion, and without adversely affecting the pre-emphasis function.

The present invention describes a pre-emphasis circuit topology which incorporates orthogonal pre-emphasis and de-emphasis tuning means as well as duty cycle control. The invention can improve the bandwidth of amplifiers used in wideband applications, and more specifically, shape the transient waveform in fiber optic transmit and receive applications in order to improve the intersymbol interference and reduce the bit error rate for 10 Gb/s data rates and beyond. The circuit 100 generally applies to post limiter amplifiers, and laser driver amplifiers, and more specifically to bipolar amplifier implementations using heterojunction bipolar transistor technology.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a modulator circuit configured to generate a modulated differential output signal in response to a differential input signal;
   a first control circuit configured to control a first predistortion of said differential input signal in response to a first portion of said differential output signal; and
   a second control circuit configured to control a second predistortion of said differential input signal in response to a second portion of said differential output signal.

2. The apparatus according to claim 1, wherein a first adjustable current source controls said first predistortion.

3. The apparatus according to claim 2, wherein a second adjustable current source controls said second predistortion.

4. The apparatus according to claim 1, further comprising:
   a delay circuit (i) coupled between said first and second control circuits and (ii) configured to delay said first and second portions of said differential input signal.

5. The apparatus according to claim 1, further comprising:
   a third control circuit configured to control a DC offset of said differential input signal.

6. The apparatus according to claim 1, wherein said first control circuit comprises a positive peak control circuit.

7. The apparatus according to claim 2, wherein said second control circuit comprises a negative peak control circuit.

8. The apparatus according to claim 1, wherein said first and second predistortion is configured to provide pre-emphasis and de-emphasis of said differential input signal.

9. The apparatus according to claim 8, wherein said apparatus is further configured to provide duty cycle distortion correction for said pre-emphasis and said de-emphasis.

10. The apparatus according to claim 1, wherein said first control circuit comprises:
    a first one or more capacitors coupled to said differential input signal; and
    a first one or more resistors coupled to said one or more capacitors, wherein said first one or more capacitors and said first one or more resistors are configured to control a first delay time constant.

11. The apparatus according to claim 9, wherein said second control circuit comprises:
    a second one or more capacitors coupled to said differential input signal; and
    a second one or more resistors coupled to said one or more capacitors, wherein said second one or more capacitors and said second one or more resistors are configured to control a second delay time constant.

12. The apparatus according to claim 1, wherein said apparatus is further configured to provide AC coupling of said differential input signal and said differential output signal.

13. The apparatus according to claim 1, wherein said apparatus is further configured to provide pre-emphasis and de-emphasis control of said differential input signal and duty cycle distortion control of said pre-emphasis and said de-emphasis.

14. An apparatus comprising:
    means for generating a modulated differential output signal in response to a differential input signal;
    means for controlling a first predistortion of said differential input signal in response to a first portion of said differential output signal; and
    means for controlling a second predistortion of said differential input signal in response to a second portion of said differential output signal.

15. A method for controlling pre-emphasis and de-emphasis of a differential input signal, comprising the steps of:
    (A) generating a modulated differential output signal in response to a differential input signal; and
    (B) controlling a first predistortion of said differential input signal in response to a predetermined portion of said differential output signal; and (C) controlling a second predistortion of said differential input signal in response to a second portion of said differential output signal.

16. The method according to claim 15, further comprising the step of:

delaying said first and second portions of said differential input signal.

17. The method according to claim 15, further comprising the step of:

controlling a DC offset of said differential output signal.

18. The method according to claim 16, wherein step (B) further comprises:

controlling a positive peak of said differential output signal.

19. The method according to claim 15, wherein step (C) further comprises:

controlling a negative peak of said differential output signal.

* * * * *